(12) United States Patent
Tsai et al.

(10) Patent No.: US 11,791,300 B2
(45) Date of Patent: Oct. 17, 2023

(54) ELECTRONIC PACKAGE AND CIRCUIT STRUCTURE THEREOF

(71) Applicant: SILICONWARE PRECISION INDUSTRIES CO., LTD., Taichung (TW)

(72) Inventors: Fang-Lin Tsai, Taichung (TW); Chia-Yu Kuo, Taichung (TW); Pei-Geng Weng, Taichung (TW); Wei-Son Tsai, Taichung (TW); Yih-Jenn Jiang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 40 days.

(21) Appl. No.: 17/135,161

(22) Filed: Dec. 28, 2020

(65) Prior Publication Data

US 2022/0148996 A1    May 12, 2022

(30) Foreign Application Priority Data

Nov. 12, 2020   (TW) .................................. 109139527

(51) Int. Cl.
*H01L 23/31*    (2006.01)
*H01L 23/00*    (2006.01)

(52) U.S. Cl.
CPC .......... *H01L 24/20* (2013.01); *H01L 23/3157* (2013.01); *H01L 2224/211* (2013.01); *H01L 2224/2101* (2013.01); *H01L 2224/214* (2013.01); *H01L 2224/2105* (2013.01); *H01L 2924/3511* (2013.01)

(58) Field of Classification Search
CPC ................. H01L 24/20; H01L 23/3157; H01L 2224/2101; H01L 2224/2105; H01L 2224/211; H01L 2224/214; H01L 2924/3511
See application file for complete search history.

(56) References Cited

U.S. PATENT DOCUMENTS

| | | | | |
|---|---|---|---|---|
| 8,535,989 B2* | 9/2013 | Sankman | ............ | H01L 25/0655 257/E23.116 |
| 2012/0329212 A1* | 12/2012 | Leal | .................... | H01L 23/3135 257/E21.502 |
| 2017/0317029 A1* | 11/2017 | Hsieh | ..................... | H01L 25/105 |
| 2018/0068983 A1* | 3/2018 | Chang | ................... | H01L 25/105 |
| 2021/0305180 A1* | 9/2021 | Huang | ................ | H01L 23/3121 |

* cited by examiner

*Primary Examiner* — Timor Karimy
(74) *Attorney, Agent, or Firm* — Kelly & Kelley, LLP

(57) ABSTRACT

An electronic package is provided, where a circuit layer and a metal layer having a plurality of openings are formed on a dielectric layer of a circuit portion to reduce the area ratio of the metal layer to the dielectric layer, so as to reduce stress concentration and prevent warping of the electronic package.

11 Claims, 5 Drawing Sheets

ELECTRONIC PACKAGE AND CIRCUIT STRUCTURE THEREOF

BACKGROUND

1. Technical Field

The present disclosure relates to a semiconductor packaging process, and more particularly, to an electronic package and circuit structure thereof for improving the reliability.

2. Description of Related Art

With the rapid development of the electronic industry, electronic products are trending towards multiple functions and high performance. In order to meet the packaging requirement for miniaturization of the semiconductor packages, a wafer level packaging (WLP) technique has been developed.

FIGS. 1A to 1D are schematic cross-sectional views illustrating a method for fabricating a conventional wafer level semiconductor package 1.

As shown in FIG. 1A, a thermal release tape 11 is formed on a carrier 10.

Then, a plurality of semiconductor components 12 are disposed on the thermal release tape 11. Each of the semiconductor components 12 has an active face 12a and a non-active face 12b opposing to the active face 12a. A plurality of electrode pads 120 are provided on each of the active faces 12a, and each of the active faces 12a is attached onto the thermal release tape 11.

As shown in FIG. 1B, an encapsulant 13 is formed on the thermal release tape 11 to encapsulate the semiconductor components 12.

As shown in FIG. 1C, the encapsulant 13 is cured by performing a baking process, while the thermal release tape 11 loses adhesion after being heated. Thus, the thermal release tape 11 and the carrier 10 can be removed together to expose the active faces 12a of the semiconductor components 12.

As shown in FIG. 1D, a redistribution layer (RDL) process is performed to form a redistribution structure 14 including dielectric layers 140 and circuit layers 141 on the encapsulant 13 and the active faces 12a of the semiconductor components 12, such that the redistribution structure 14 is electrically connected with the electrode pads 120 of the semiconductor components 12, wherein a large area of patterned metal layer 141' is arranged on a surface of the redistribution structure 14 so as to improve the efficiency of heat dissipation, and the patterned metal layer 141' can also be used for grounding or transmitting power to the semiconductor components 12. Thereafter, an insulating protective layer 15 is formed on the redistribution structure 14, and parts of the surface of the redistribution structure 14 are exposed from the insulating protective layer 15 for bonding with conductive components 16, such as solder balls. Finally, a singulation process is performed.

However, in the conventional semiconductor package 1, the metal layer 141' occupies too much area ratio, and the structural strength of the circuit layers 141 of the redistribution structure 14 is too weak, which makes the stress distribution of the redistribution structure 14 easily to be uneven, resulting in uneven flatness in each layer of the dielectric layers 140 of the redistribution structure 14, such that the semiconductor package 1 is prone to warpage, and the circuit layer 141 cannot be effectively electrically connected with the electrode pads 120 of the semiconductor components 12, resulting in poor electrical performance, which in turn leads to problems such as low yield and poor product reliability.

Therefore, there is a need for a solution that addresses the aforementioned shortcomings in the prior art.

SUMMARY

In view of the aforementioned shortcomings of the prior art, the present disclosure provides a circuit structure, which includes: a plurality of dielectric layers; a plurality of circuit layers disposed on the plurality of dielectric layers; at least one first metal layer disposed on one of the plurality of dielectric layers and having a plurality of first openings; and at least one second metal layer disposed on at least one of another plurality of dielectric layers and having a plurality of second openings, the first metal layer and the second metal layer being located on the different dielectric layers, wherein a position of the first openings is not aligned with a position of the second openings.

In the circuit structure above, at least one of the first openings and the second openings are rectangular.

In the circuit structure above, the first metal layer and the second metal layer are dummy copper sheets.

In the circuit structure above, the first metal layer and the second metal layer are circuit layers.

In the circuit structure above, the second metal layer is plural and disposed at where all of the plurality of dielectric layers that are not provided with the first metal layer, such that positions of the second openings of the two second metal layers on the different dielectric layers are misaligned with each other.

The present disclosure further provides an electronic package, which includes: an encapsulation layer having a first side and a second side opposing to the first side; at least one electronic component embedded in the encapsulation layer; and the aforementioned circuit structure disposed on the first side of the encapsulation layer, the circuit layers being electrically connected with the electronic component.

In the electronic package above, the electronic component is exposed from the second side of the encapsulation layer.

In the electronic package above, at least one of the first metal layer and the second metal layer are not electrically connected with the electronic component.

In the electronic package above, at least one of the first metal layer and the second metal layer are electrically connected with the electronic component.

In the electronic package above, the present disclosure further comprises a plurality of conductive pillars embedded in the encapsulation layer and electrically connected with the circuit layers.

In the electronic package above, the present disclosure further comprises a plurality of conductive components formed on the circuit structure and electrically connected with the circuit layers.

As can be understood from the above, the electronic package and the circuit structure thereof in the present disclosure allow stress distribution to be distributed as a result of forming a metal layer having openings on the dielectric layer to reduce the area ratio of the metal layer to the dielectric layer. Compared to the prior art, the present disclosure can prevent warpage from happening to the circuit structure (that is, the present disclosure can prevent warping of the electronic package), thereby improving the yield and the reliability of the product.

Furthermore, since the positions of the openings of each of the metal layers are not aligned, the problem of stress concentration in the circuit structure is prevented, such that the flatness of the dielectric layer can be increased. Compared to the prior art, the present disclosure can prevent warpage of the electronic package or the circuit structure.

BRIEF DESCRIPTION OF THE DRAWINGS

FIG. 2B' is a schematic partial top view of FIG. 2B.

DETAILED DESCRIPTION

Figure 1A:
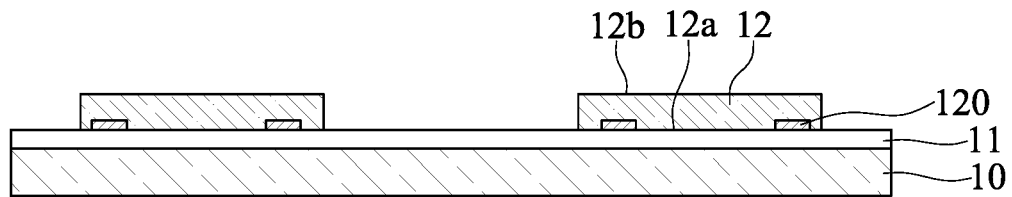
FIGS. 1A to 1D are schematic cross-sectional views illustrating a method for fabricating a conventional semiconductor package.
Figure 1B:
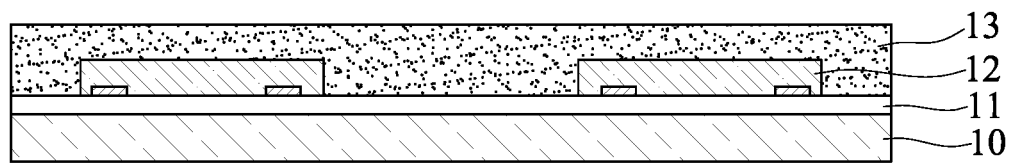
Figure 1C:
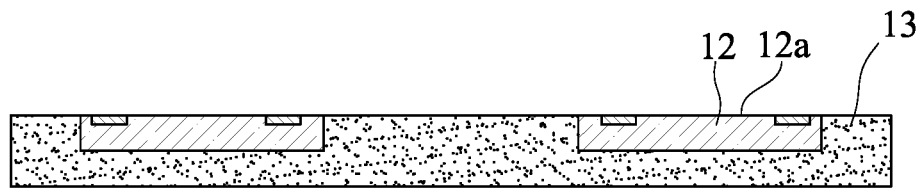
Figure 1D:
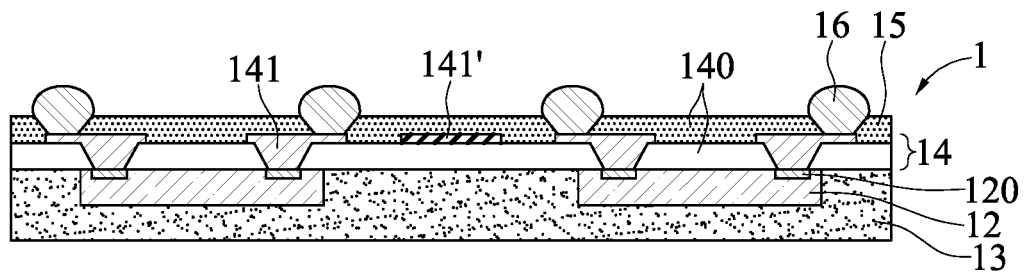

Implementations of the present disclosure are described below by specific embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIGS. 2A to 2D are schematic cross-sectional views illustrating a method for fabricating an electronic package 2 in accordance with the present disclosure.

Figure 2A:
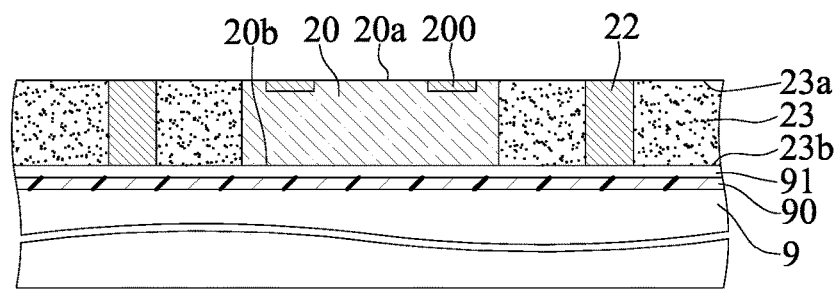
FIGS. 2A to 2D are schematic cross-sectional views illustrating a method for fabricating an electronic package in accordance with the present disclosure.

As shown in FIG. 2A, an encapsulation layer 23 having a first side 23a and a second side 23b opposing to the first side 23a is provided, and at least one electronic component 20 and a plurality of conductive pillars 22 are embedded in the encapsulation layer 23.

In an embodiment, the material for forming the encapsulation layer 23 is an insulating material, such as molding compound, dry film, Poly-p-Polybenzoxazole (PBO), polyimide (PI), prepreg (PP), Ajinomoto build-up film (ABF), epoxy resin or photoresist material.

Moreover, the electronic component 20 is an active component, a passive component or a combination thereof, wherein the active component is a semiconductor chip, and the passive component is a resistor, a capacitor or an inductor. For example, the electronic component 20 is a semiconductor chip, such as a power management chip, a dynamic random access memory, an application processor, etc. The electronic component 20 has an active face 20a and a non-active face 20b opposing to the active face 20a. The active face 20a has a plurality of electrode pads 200, and the non-active face 20b of the electronic component 20 is flush with the second side 23b of the encapsulation layer 23. In another embodiment, the second side 23b of the encapsulation layer 23 can cover the non-active face 20b of the electronic component 20.

In addition, the encapsulation layer 23 and the electronic component 20 can be fabricated in various ways. For example, the encapsulation layer 23 is formed by molding or lamination, but the present disclosure is not limited to as such. Specifically, the electronic component 20 and the conductive pillars 22 can first dispose on a support member (not shown), and then the encapsulation layer 23 for covering the electronic component 20 and the conductive pillars 22 are formed. Thereafter, the support member is removed after the second side 23b of the encapsulation layer 23 is bonded onto a carrier 9. Alternatively, the conductive pillars 22 and the electronic component 20 (with the non-active face 20b) can first dispose on the carrier 9, and then the encapsulation layer 23 is formed to cover the electronic component 20 and the conductive pillars 22.

Furthermore, the conductive pillars 22 are made of metal material (e.g., copper [Cu]) or solder material, and a release layer 90 and a bonding layer 91 can be sequentially formed on the carrier 9, such that the second side 23b of the encapsulation layer 23 and the non-active face 20b of the electronic component 20 are bonded onto the bonding layer 91. Specifically, the release layer 90 is, for example, a thermal release tape, a light-sensitive release film or a mechanical release structure, and the bonding layer 91 is an adhesive material.

Figure 2B:
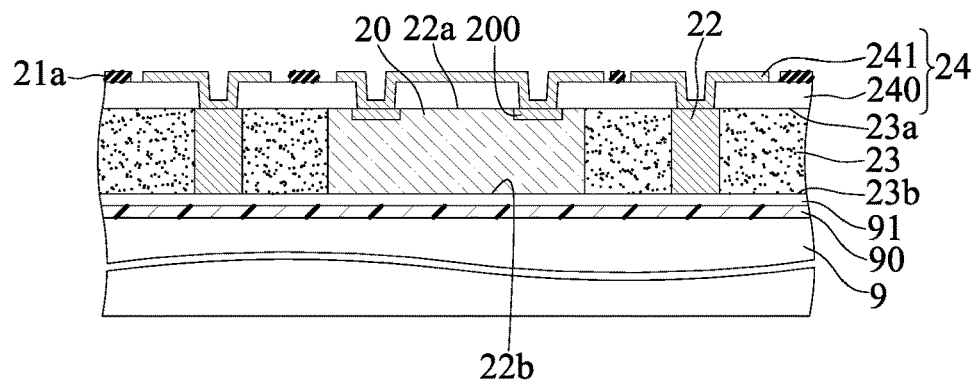
Figure 2B:
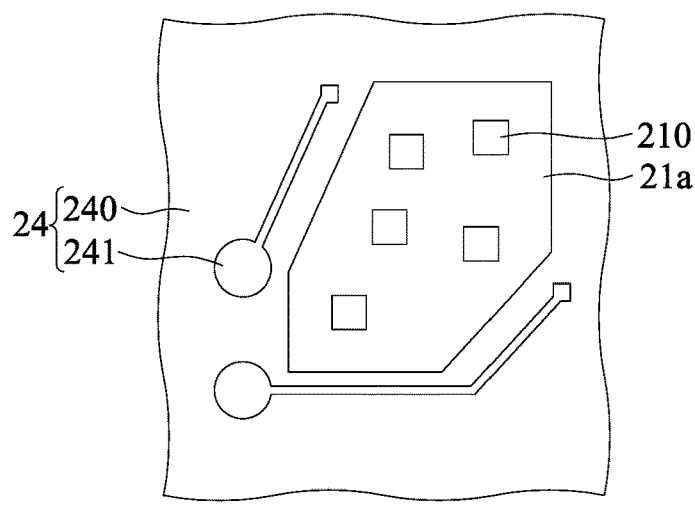

As shown in FIG. 2B, a redistribution layer (RDL) fabrication process is performed to form a circuit portion 24 on the first side 23a of the encapsulation layer 23. The circuit portion 24 is electrically connected with the electronic component 20 and the conductive pillars 22, and a first metal layer 21a is formed on the circuit portion 24.

In an embodiment, the circuit portion 24 includes at least one dielectric layer 240 and a circuit layer 241 disposed on a circuit region of the dielectric layer 240, and the circuit layer 241 is electrically connected with the electrode pads 200 of the electronic component 20 and the conductive pillars 22.

Moreover, the first metal layer 21a is disposed on a non-circuit region of the dielectric layer 240, and the first metal layer 21a and the circuit layer 241 can be fabricated together. Alternatively, the first metal layer 21a and the circuit layer 241 can be fabricated by different processes. As such, the material of the first metal layer 21a and the circuit layer 241 can be the same (e.g., copper) or different.

Figure 3A:
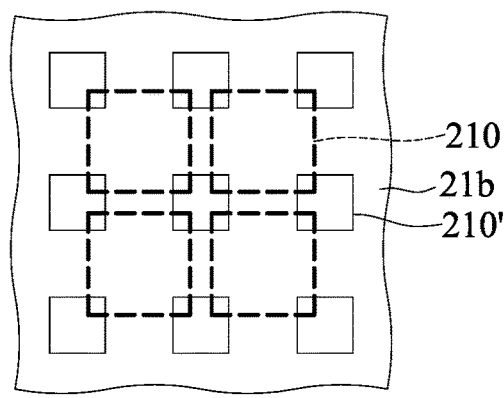
FIGS. 3A, 3B, 3C and 3D are other aspects of schematic partial top view of FIG. 2D.
Figure 3B:
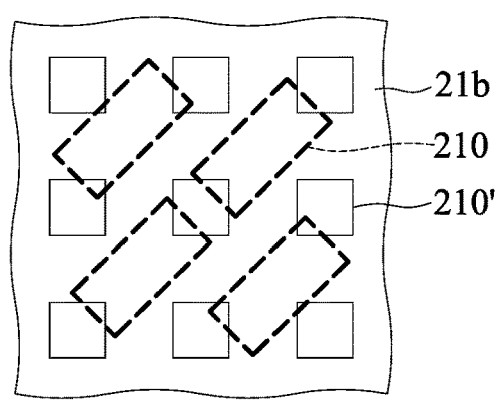
Figure 3C:
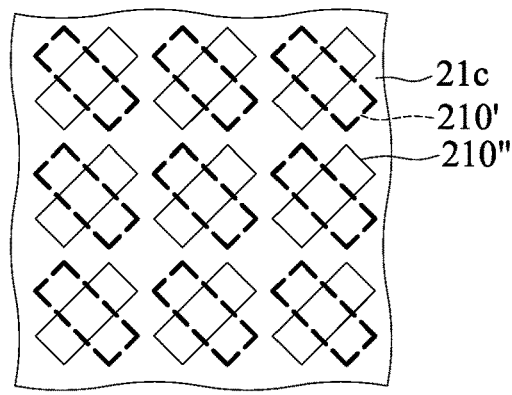
Figure 3D:
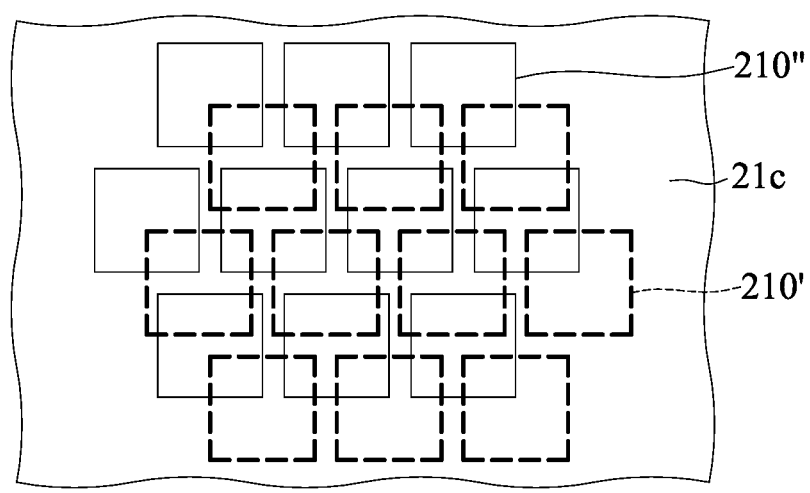

In addition, as shown in FIG. 2B', the first metal layer 21a is a mesh having a plurality of first openings 210. It can be understood that the profile and the quantity of the first openings 210 are not limited to the rectangular shape shown in the figures (e.g., squares or rectangles shown in FIG. 3B), but can be other quantities or profiles of shapes.

Figure 2C:
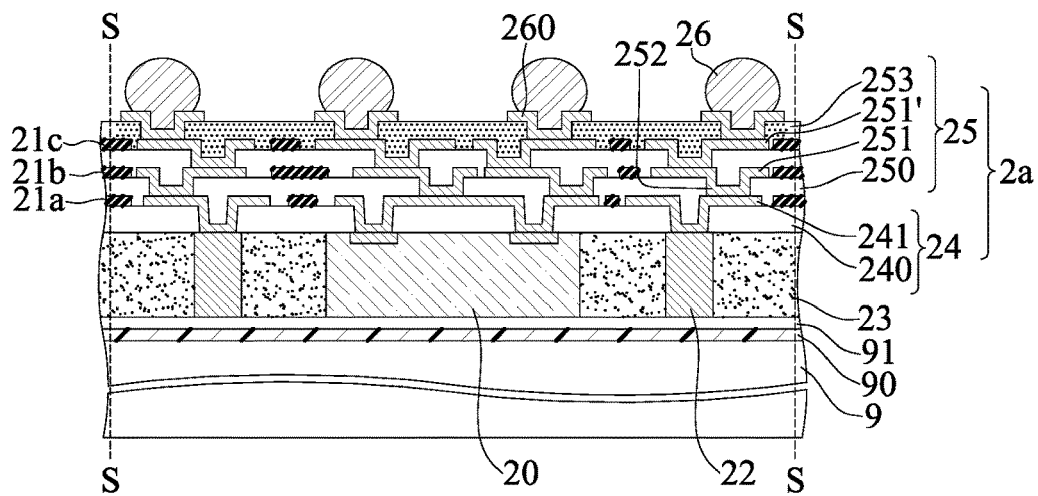

As shown in FIG. 2C, another redistribution layer (RDL) fabrication process is performed to form a build-up portion 25 on the circuit portion 24 and the first metal layer 21a, so that the build-up portion 25 and the circuit portion 24 serve as a circuit structure 2a. At least one second metal layer 21b, 21c is formed on the build-up portion 25. Then, a plurality of conductive components 26 are formed on the build-up portion 25.

In an embodiment, the build-up portion 25 has at least one dielectric layer 250 bonded with the second metal layers 21b, 21c, circuit layers 251, 251' formed on the dielectric layers 250, and a plurality of conductive blind vias 252 disposed in the dielectric layers 250. And since the conductive blind vias 252 are electrically connected with the circuit layers 241, 251, the outermost dielectric layer 250 and circuit layer 251' of the build-up portion 25 are formed with an insulating protective layer 253, such that the outermost portions of the circuit layer 251' are exposed from the insulating protective layer 253 so as for the conductive components 26 to be bonded on the circuit layer 251'.

Further, the second metal layers 21b, 21c are disposed on a non-circuit region of the dielectric layer 250, and the second metal layers 21b, 21c and the circuit layers 251, 251' can form together. Alternatively, the second metal layers 21b, 21c and the circuit layers 251, 251' can be fabricated by different processes. As such, the material of the second metal layers 21b, 21c and the circuit layer 251 can be the same (e.g., copper) or different.

Referring to FIGS. 3A to 3D together, the second metal layers 21b, 21c are mesh and have a plurality of second openings 210', 210", so that the circuit layer 251 is intervally arranged along the edge of the second metal layers 21b, 21c. It can be understood that the profile and the quantity of the second openings 210', 210" are not limited to the rectangular shape shown in the figures (e.g., squares or the rectangles), but can be other quantities or profiles of shapes. Preferably, the positions of the openings of the metal layers of two adjacent layers (i.e., upper and lower layers) are not aligned, as shown by the misaligned positions in FIGS. 3A, 3B, 3C and 3D.

Further, the conductive components 26 are solder balls, metal bumps, or metal needles, etc. An under bump metallurgy (UBM) 260 is formed on the circuit layer 251' before forming the conductive components 26 so as to facilitate the bonding with the conductive components 26.

Figure 2D:
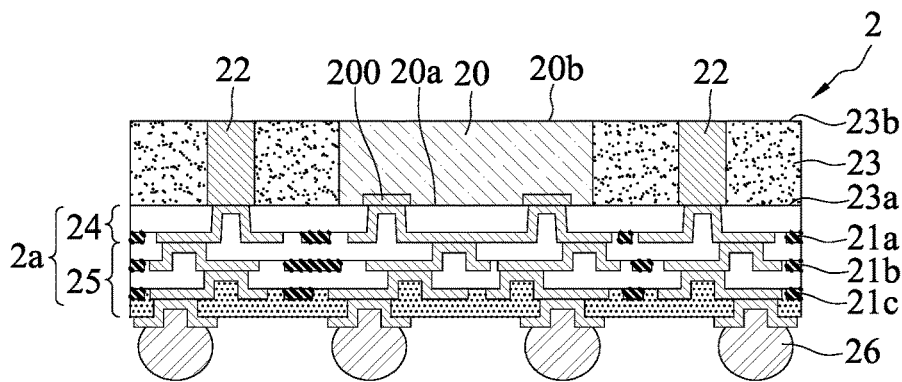

As shown in FIG. 2D, the carrier 9, the release layer 90 and the bonding layer 91 are removed, so that the non-active face 20b of the electronic component 20 is exposed from the second side 23b of the encapsulation layer 23. Then, a singulation process is performed along the cutting paths S shown in FIG. 2C to complete the fabrication of the electronic package 2.

In an embodiment, the first metal layer 21a and the second metal layers 21b, 21c are used as dummy copper sheets (dummy Cu) without being electrically connected with the electronic component 20. Alternatively, the first metal layer 21a and the second metal layers 21b, 21c can be used as circuit layers as needed, which is electrically connected with a portion of the electrode pads 210 of the electronic component 20 for the use of heat dissipation, grounding and/or transmitting power for the electronic component 20.

Figure 2E:
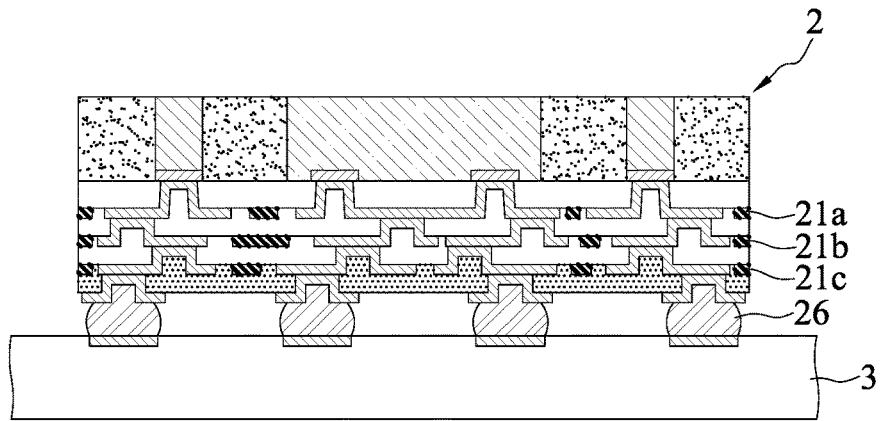
FIG. 2E is a schematic cross-sectional view of a subsequent process of FIG. 2D.

Besides, in a subsequent fabricating process, the electronic package 2 can be bonded onto an electronic device 3 such as a circuit board via the conductive components 26, as shown in FIG. 2E.

In the circuit structure 2a of the electronic package 2 of the present disclosure, the first metal layer 21a and the second metal layers 21b, 21c have a plurality of first openings 210 and second openings 210', 210" to reduce the area ratio that the first metal layer 21a and the second metal layers 21b, 21c occupied in the dielectric layers 240, 250, thereby reducing stress concentration. As such, compared to the prior art, the present disclosure can prevent warpage from happening to the circuit structure 2a (that is, preventing the electronic package 2 from being warped), such that the circuit layer 241 can be effectively electrically connected with the electronic component 20, thereby improving the yield and the reliability of the product.

Furthermore, since the positions of the openings of the metal layers of any two layers or two adjacent layers (i.e., upper and lower layers) are not aligned, as shown by the misaligned positions in FIGS. 3A, 3B, 3C and 3D, the problem of stress concentration in the circuit structure 2a is reduced, thereby increasing the flatness of the dielectric layers 240, 250 and preventing warpage from happening to the electronic package 2 or the circuit structure 2a.

The present disclosure provides a circuit structure 2a, which comprises a plurality of dielectric layers 240, 250, a plurality of circuit layers 241, 251, 251' disposed on the plurality of dielectric layers 240, 250, at least one first metal layer 21a and at least one second metal layer 21b, 21c.

The first metal layer 21a is disposed on one of the plurality of dielectric layers 240 and has a plurality of first openings 210.

The second metal layers 21b, 21c are disposed on at least one of the other plurality of dielectric layers 250 and has a plurality of second openings 210', 210" (the first metal layer 21a and the second metal layers 21b, 21c are in different layers), wherein the positions of the first openings 210 are not aligned with the positions of the second openings 210', 210".

In an embodiment, the first openings 210 and/or the second openings 210', 210" are rectangular.

In an embodiment, the first metal layer 21a and the second metal layers 21b, 21c are dummy copper sheets.

In an embodiment, the first metal layer 21a and the second metal layers 21b, 21c are circuit layers.

In an embodiment, a plurality of second metal layers 21b, 21c are disposed on all the plurality of dielectric layers 250 without disposing the first metal layer 21a, such that the positions of the second openings 210', 210" of two of the second metal layers 21b, 21c on the different dielectric layers 250 are misaligned with each other.

The present disclosure further provides an electronic package 2, which comprises an encapsulation layer 23, at least one electronic component 20 and the circuit structure 2a.

The encapsulation layer 23 has a first side 23a and a second side 23b opposing to the first side 23a.

The electronic component 20 is embedded in the encapsulation layer 23.

The circuit structure 2a is disposed on the first side 23a of the encapsulation layer 23, and the circuit layer 241 is electrically connected with the electronic component 20.

In an embodiment, the electronic component 20 is exposed from the second side 23b of the encapsulation layer 23.

In an embodiment, the first metal layer 21a and/or the second metal layers 21b, 21c are not electrically connected with the electronic component 20.

In an embodiment, the first metal layer 21a and/or the second metal layers 21b, 21c are electrically connected with the electronic component 20.

In an embodiment, the electronic package 2 further comprises a plurality of conductive pillars 22 embedded in the encapsulation layer 23 and electrically connected with the circuit layer 241.

In an embodiment, the electronic package 2 further comprises a plurality of conductive components 26 formed on the circuit structure 2a and electrically connected with the circuit layer 251'.

In conclusion, in the electronic package and the circuit structure thereof of the present disclosure, the design of the mesh metal layer reduces the area ratio of the dielectric layer occupied by the mesh metal layer, thereby reducing stress concentration. As such, the present disclosure can prevent warpage from happening to the circuit structure (that is, preventing the electronic package from being warped), such that the circuit layer can be effectively electrically connected with the electronic component, thereby improving the yield and the reliability of the product.

Moreover, since the positions of the openings of each of the metal layers are not aligned, the problem of stress concentration in the circuit structure is reduced and the flatness of the dielectric layer is increased, thereby preventing warpage from happening to the electronic package or the circuit structure.

The above embodiments are provided for illustrating the principles of the present disclosure and its technical effect, and should not be construed as to limit the present disclosure in any way. The above embodiment can be modified by one of ordinary skill in the art without departing from the spirit and scope of the present disclosure. Therefore, the scope claimed of the present disclosure should be defined by the following claims.

What is claimed is:

1. A circuit structure, comprising:
   a first dielectric layer having a first surface;
   a first circuit layer disposed on the first surface of the first dielectric layer;
   at least one first metal layer disposed on the first surface of the first dielectric layer and having a plurality of first openings, wherein the first metal layer is a mesh;
   a second dielectric layer disposed on the first surface of the first dielectric layer, the first circuit layer and the first metal layer and having a second surface;
   a second circuit layer disposed on the second surface of the second dielectric layer; and
   at least one second metal layer disposed on the second surface of the second dielectric layer and having a plurality of second openings, wherein the second metal layer is a mesh,
   wherein a position of each of the first openings is not aligned with a position of each of the second openings, and the first metal layer and the second metal layer are free from being electrically connected with the first circuit layer and the second circuit layer.

2. The circuit structure of claim 1, wherein at least one of the first openings and the second openings are rectangular.

3. The circuit structure of claim 1, wherein the first metal layer and the second metal layer are dummy copper sheets.

4. The circuit structure of claim 1, wherein the first metal layer and the second metal layer are circuit layers.

5. The circuit structure of claim 1, further comprising a third dielectric layer and at least one third metal layer, the third dielectric layer disposed on the second surface of the second dielectric layer and having a third surface, the third metal layer disposed on the third surface of the third dielectric layer and having a plurality of third openings, wherein the third metal layer is a mesh, and the second openings and the third openings are misaligned with each other.

6. An electronic package, comprising:
   an encapsulation layer having a first side and a second side opposing to the first side;
   at least one electronic component embedded in the encapsulation layer; and
   the circuit structure of claim 1 disposed on the first side of the encapsulation layer, the first circuit layer and the second circuit layer being electrically connected with the electronic component.

7. The electronic package of claim 6, wherein the electronic component is exposed from the second side of the encapsulation layer.

8. The electronic package of claim 6, wherein at least one of the first metal layer and the second metal layer are not electrically connected with the electronic component.

9. The electronic package of claim 6, wherein at least one of the first metal layer and the second metal layer are electrically connected with the electronic component.

10. The electronic package of claim 6, further comprising a plurality of conductive pillars embedded in the encapsulation layer and electrically connected with the first circuit layer and the second circuit layer.

11. The electronic package of claim 6, further comprising a plurality of conductive components formed on the circuit structure and electrically connected with the first circuit layer and the second circuit layer.

* * * * *